United States Patent
Wu et al.

(10) Patent No.: US 10,283,512 B2
(45) Date of Patent: May 7, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Wei Cheng Wu, Zhubei (TW); Li-Feng Teng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/584,314

(22) Filed: May 2, 2017

(65) Prior Publication Data

US 2018/0151582 A1 May 31, 2018

Related U.S. Application Data

(60) Provisional application No. 62/427,463, filed on Nov. 29, 2016.

(51) Int. Cl.
*H01L 27/11531* (2017.01)
*H01L 27/11517* (2017.01)
(Continued)

(52) U.S. Cl.
CPC .. *H01L 27/11531* (2013.01); *H01L 21/28273* (2013.01); *H01L 27/115* (2013.01);
(Continued)

(58) Field of Classification Search
CPC ......... H01L 27/11517; H01L 27/11521; H01L 27/11526; H01L 29/42324; H01L 29/42328; H01L 29/49; H01L 29/517; H01L 29/66545; H01L 29/66825; H01L 27/11531; H01L 27/11539;
(Continued)

(56) References Cited

U.S. PATENT DOCUMENTS

| 7,005,345 | B2 * | 2/2006 | Yaegashi | .............. H01L 27/105 |
| | | | | 257/E21.691 |
| 8,101,477 | B1 | 1/2012 | Power | |

(Continued)

FOREIGN PATENT DOCUMENTS

KR    10-2015-0056441 A    5/2015

OTHER PUBLICATIONS

Office Action issued in corresponding German Patent Application No. 10 2017 103 838.8, dated Aug. 22, 2017.
(Continued)

*Primary Examiner* — Bac H Au
(74) *Attorney, Agent, or Firm* — McDermott Will & Emery LLP

(57) ABSTRACT

A semiconductor device includes a non-volatile memory. The non-volatile memory includes a first dielectric layer disposed on a substrate, a floating gate disposed on the dielectric layer, a control gate. A second dielectric layer is disposed between the floating gate and the control gate, having one of a silicon nitride layer, a silicon oxide layer and multilayers thereof. A third dielectric layer is disposed between the second dielectric layer and the control gate, and includes a dielectric material having a dielectric constant higher than silicon nitride.

17 Claims, 12 Drawing Sheets

(51) Int. Cl.
*H01L 27/11526* (2017.01)
*H01L 29/66* (2006.01)
*H01L 27/115* (2017.01)
*H01L 27/11521* (2017.01)
*H01L 27/11548* (2017.01)
*H01L 27/11551* (2017.01)
*H01L 29/423* (2006.01)
*H01L 21/28* (2006.01)
*H01L 27/11536* (2017.01)
*H01L 27/11539* (2017.01)

(52) U.S. Cl.
CPC .. *H01L 27/11517* (2013.01); *H01L 27/11521* (2013.01); *H01L 27/11526* (2013.01); *H01L 27/11536* (2013.01); *H01L 27/11539* (2013.01); *H01L 27/11548* (2013.01); *H01L 27/11551* (2013.01); *H01L 29/42328* (2013.01); *H01L 29/66545* (2013.01); *H01L 29/66825* (2013.01)

(58) Field of Classification Search
CPC ......... H01L 27/11536; H01L 21/28273; H01L 27/11551; H01L 27/115; H01L 27/11548
See application file for complete search history.

(56) References Cited

U.S. PATENT DOCUMENTS

| | | | |
|---|---|---|---|
| 9,728,544 | B2 | 8/2017 | Yu et al. |
| 9,842,848 | B2 | 12/2017 | Wu et al. |
| 2006/0203552 | A1 | 9/2006 | Chen et al. |
| 2008/0029805 | A1 | 2/2008 | Shimamoto et al. |
| 2008/0315281 | A1* | 12/2008 | Park .................. H01L 27/105 257/315 |
| 2009/0134453 | A1 | 5/2009 | Govoreanu et al. |
| 2009/0207662 | A1 | 8/2009 | Wang et al. |
| 2014/0227839 | A1* | 8/2014 | Shinohara ......... H01L 29/42344 438/261 |
| 2015/0060989 | A1 | 3/2015 | Loiko et al. |
| 2015/0137207 | A1 | 5/2015 | Chuang et al. |
| 2015/0263010 | A1 | 9/2015 | Chuang et al. |
| 2016/0013197 | A1 | 1/2016 | Liu |
| 2016/0141296 | A1 | 5/2016 | Yang et al. |
| 2016/0293427 | A1* | 10/2016 | Mihara ............. H01L 27/11573 |
| 2017/0162590 | A1 | 6/2017 | Chuang et al. |
| 2018/0151581 | A1* | 5/2018 | Wu .................. H01L 21/28273 |
| 2018/0151707 | A1* | 5/2018 | Wu .................. H01L 21/28273 |

OTHER PUBLICATIONS

Office Action issued in corresponding U.S. Appl. No. 15/428,823, dated Jul. 14, 2017.
Office Action issued in U.S. Appl. No. 15/428,823, dated Jan. 25, 2018.
Notice of Allowance dated Aug. 6, 2018 in U.S. Appl. No. 15/428,823 (15 pages).
Office Action dated Mar. 22, 2018 in corresponding German Patent Application No. 10 2017 116 221.6 (8 pages).
Non-final Office Action dated Nov. 1, 2018 in U.S. Appl. No. 15/648,201 (29 pages).
Notice of Reason for Refusal issued Oct. 3, 2018 in corresponding Korean Application No. 10-2017-0097516, including English translation (13 pages).
Notice of Reason for Refusal dated Oct. 3, 2018 in corresponding Korean Application No. 10-2017-0097516, including English translation (13 pages).

* cited by examiner

US 10,283,512 B2

SEMICONDUCTOR DEVICE AND MANUFACTURING METHOD THEREOF

CROSS-REFERENCE TO RELATED APPLICATIONS

This application claims priority to U.S. Provisional Patent Application 62/427,463 filed Nov. 29, 2016, the entire disclosure of which is incorporated herein by reference.

TECHNICAL FIELD

The disclosure relates to semiconductor integrated circuits, more particularly to semiconductor devices including non-volatile memory cells and peripheral circuits, and manufacturing processes thereof.

BACKGROUND

As the semiconductor industry has progressed into nanometer technology process nodes in pursuit of higher device density, higher performance, and lower costs, there have been challenges in reducing contact resistance and suppressing an increase of the number of lithography operations.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
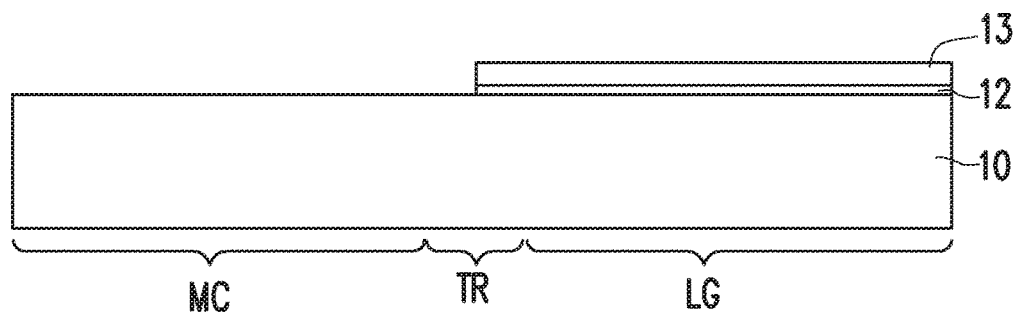
FIGS. 1A-1D show exemplary cross sectional views illustrating a sequential process for manufacturing a semiconductor device including non-volatile memory cells and peripheral logic circuits according to one embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

In the present embodiment, a semiconductor device includes non-volatile memory (NVM) cells and peripheral circuits such as logic circuits. The peripheral circuits may also include static random access memories (SRAMs). The NVM cells generally require a stacked structure in which plural layers, such as polysilicon layers, are stacked, while the peripheral logic circuits generally include field effect transistors (FETs) having a single polysilicon layer. Because of the structure differences, when, for example, an interlayer dielectric (ILD) layer is formed over the NVM cells and the peripheral logic circuits, there is a height difference in the ILD layer between an NVM cell area and a peripheral logic circuit area. Such a height difference may affect the performance of chemical mechanical polishing (CMP) on the ILD layer.

In the present disclosure, before fabricating the NVM cells and the peripheral logic circuits, a substrate in the NVM cell area is etched to make a "step" between the NVM cell area and the peripheral logic circuit area. The step height corresponds to the height difference when the ILD layer is formed if the step is otherwise not formed. It is also noted that placement of devices should be avoided near the step.

FIGS. 1A-8C generally show exemplary cross sectional views illustrating a sequential process for manufacturing a semiconductor device including non-volatile memory cells and peripheral logic circuits according to one embodiment of the present disclosure. It is understood that additional operations can be provided before, during, and after processes shown by FIGS. 1A-8C, and some of the operations described below can be replaced or eliminated, for additional embodiments of the method.

As shown in FIG. 1A, a pad oxide layer 12 is formed on the substrate 10 and a nitride layer 13 is further formed on the pad oxide layer 12. A photo resist pattern is formed over the nitride layer 13 by a lithography operation so as to cover the peripheral logic circuit area LG. By using the photo resist pattern as an etching mask, the NVM cell area MC is exposed, while the peripheral logic circuit area LG is covered by the nitride layer 13 and pad oxide layer 12. As shown in FIG. 1A, a transition area TR exists between the NVM cell area MC and the peripheral logic circuit area LG.

The substrate 10 is, for example, a p-type silicon substrate with an impurity concentration in a range from about $1 \times 10^{15}$ cm$^{-3}$ to about $1 \times 10^{18}$ cm$^{-3}$. In other embodiments, the substrate is an n-type silicon substrate with an impurity concentration in a range from about $1 \times 10^{15}$ cm$^{-3}$ to about $1 \times 10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate. In some embodiments, the pad oxide layer 12 is thermally grown silicon oxide, and the nitride layer 13 is silicon nitride. The silicon oxide and the silicon nitride can be formed by using a furnace or chemical vapor deposition (CVD). Materials for the mask layer are not limited to silicon oxide and silicon nitride, and any other suitable material for a mask layer may be used. The thickness of the pad oxide layer 12 is in a range from about 5 nm to about 20 nm and the thickness of the nitride layer 13 is in a range from about 50 nm to about 100 nm in some embodiments.

Figure 1B:
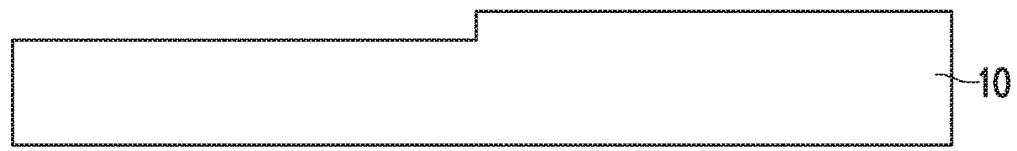

After the nitride layer 13 and pad oxide layer 12 are patterned, the NVM cell area MC is oxidized by using wet oxidation, thereby forming an oxide layer, and then the oxide layer is removed by using wet etching, thereby forming a step between the NVM cell area MC and the peripheral logic circuit area LG. Then, the nitride layer 13 and pad oxide layer 12 are removed, as shown in FIG. 1B.

In certain embodiments, by using the pad oxide layer 12 and the nitride layer 13 as an etching mask, the substrate 10 in the NVM cell area MC is etched to form the step.

Figure 1C:
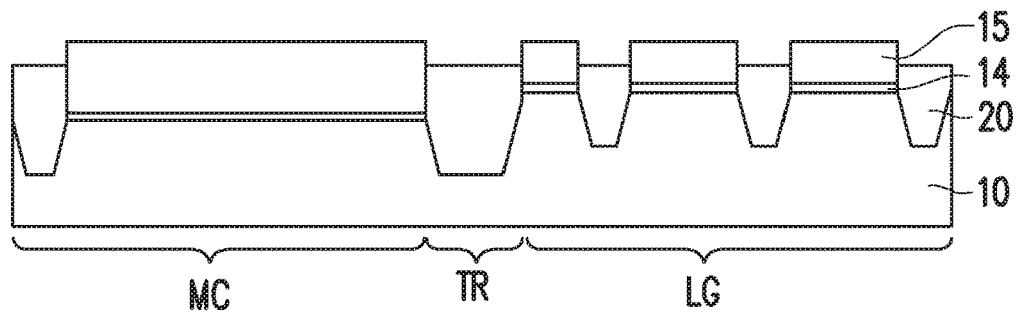

After the step is formed, isolation insulating layers 20, which are also called shallow trench isolations (STI), are formed, as shown in FIG. 1C. To form the isolation insulating layers 20, a mask layer including a silicon oxide layer 14 and a silicon nitride layer 15 is formed on the substrate 10, and the mask layer is patterned by lithography and etching operations. Then, by using the patterned mask layer as an etching mask, the substrate 10 is trench-etched to form trenches. A depth of the trenches is in a range from about 100 nm to about 1 µm in some embodiments.

The trenches are filled with an insulating (dielectric) material such as silicon oxide, and then, a planarization operation, such as CMP or an etch-back process, is performed so as to remove an upper part of the insulating material layer, thereby forming the isolation layers 20. The substrate not etched, and surrounded or separated by the STI in plan view is an active region, over which transistors or other semiconductor devices are formed. As shown in FIG. 1C, the NVM cell area MC and the peripheral logic circuit area LG may be separated by a relatively large isolation layer 20 in the transition area TR. Of course, after the isolation layers 20 are formed, the step between the cell area and the peripheral logic circuit area is maintained.

Figure 1D:
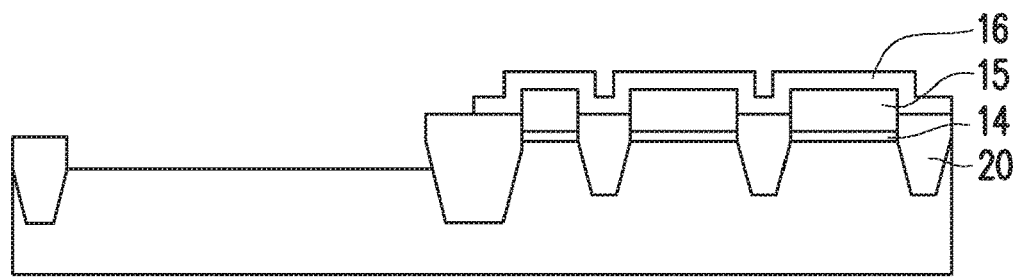

Further, the mask layer including a silicon oxide layer 14 and a silicon nitride layer 15 in the NVM cell area MC is removed, while the logic circuit area LG is covered by a protective layer 16 made of silicon nitride, as shown in FIG. 1D.

Figure 2A:
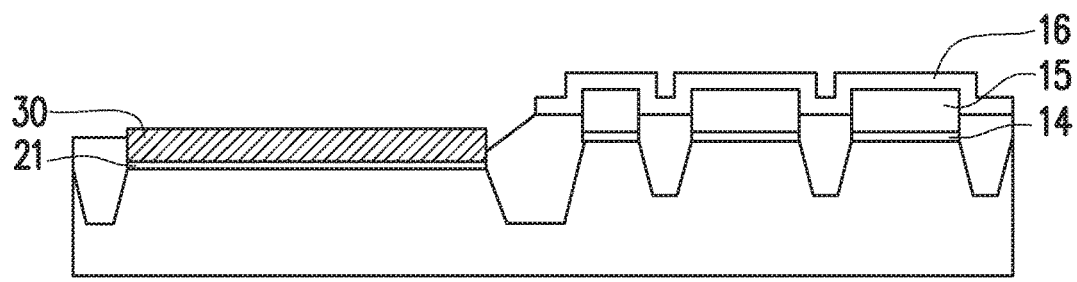
FIGS. 2A-2D show exemplary cross sectional views illustrating a sequential process for manufacturing a semiconductor device including non-volatile memory cells and peripheral logic circuits according to one embodiment of the present disclosure.

Subsequently, as shown in FIG. 2A, a first dielectric layer 21 and a first polysilicon layer 30 are formed over the substrate 10 in the NVM cell area MC. The first dielectric layer 21 is utilized as a tunnel oxide layer for NVM cells and is made of silicon oxide. The thickness of the first dielectric layer 21 is in a range from about 1 nm to about 50 nm in some embodiments. The first dielectric layer 21 can be formed by thermal oxidation or CVD.

The first polysilicon layer 30 can be formed by CVD. The thickness of the first polysilicon layer 30 as deposited is in a range from about 10 nm to about 300 nm in some embodiments. In some embodiments, the thickness of the first polysilicon layer 30 as deposited is reduced by a planarization operation, such as a chemical mechanical polishing method and/or an etch-back method. In some embodiments, CMP is first performed to make the upper surface of the polysilicon layer substantially equal to the upper surface of SiN layer 16, and then an etch-back operation is performed to obtain a desired thickness of the polysilicon layer 30. After the planarization operation, the thickness of the first polysilicon layer 30 is in a range from about 10 nm to about 200 nm in some embodiments. The first polysilicon layer 30 is appropriately doped with impurities and is utilized for floating gates of NVM cells. The polysilicon layer 30 may be replaced with an amorphous silicon layer.

Figure 2B:
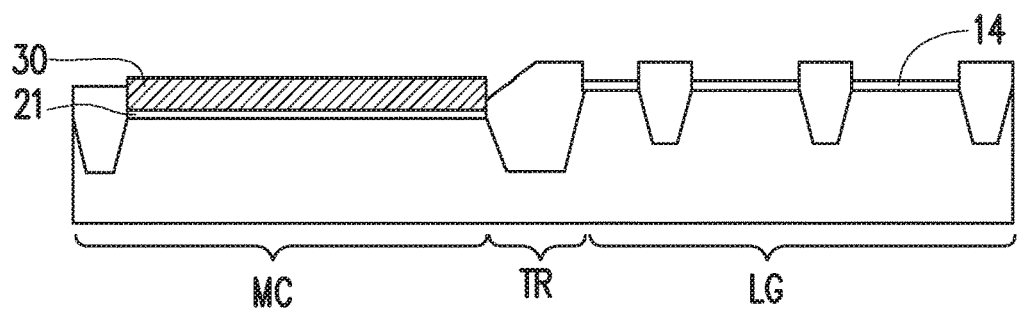

After the first polysilicon layer 30 is formed in the NVM cell area MC, the protective layer 16 and the silicon nitride layer 15 in the logic circuit area LG are removed by, for example, wet etching, as shown in FIG. 2B.

Figure 2C:
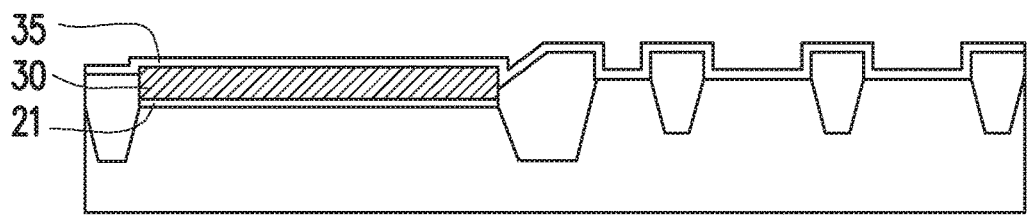

Then, a second dielectric layer 35 is formed, as shown in FIG. 2C. The second dielectric layer 35 includes one or more layers of a silicon oxide and a silicon nitride, and has a thickness of about 1 nm to 100 nm in some embodiments. The second dielectric layer 35 can be formed by CVD and patterning operations including lithography and dry etching.

Figure 2D:
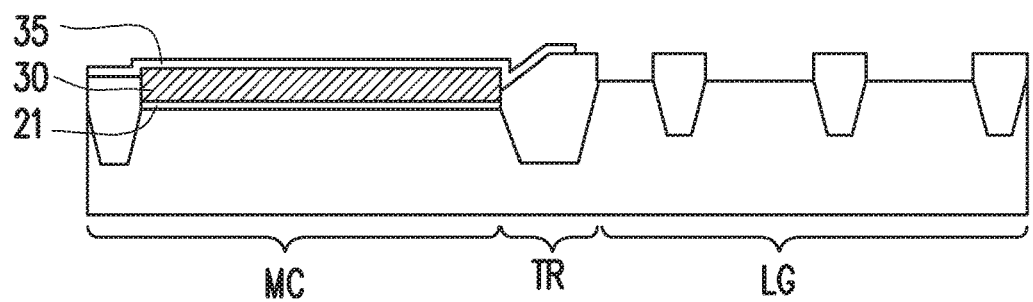

Subsequently, a patterning operation is performed to remove the second dielectric layer 35 in the logic circuit area LG, as shown in FIG. 2D.

Figure 3A:
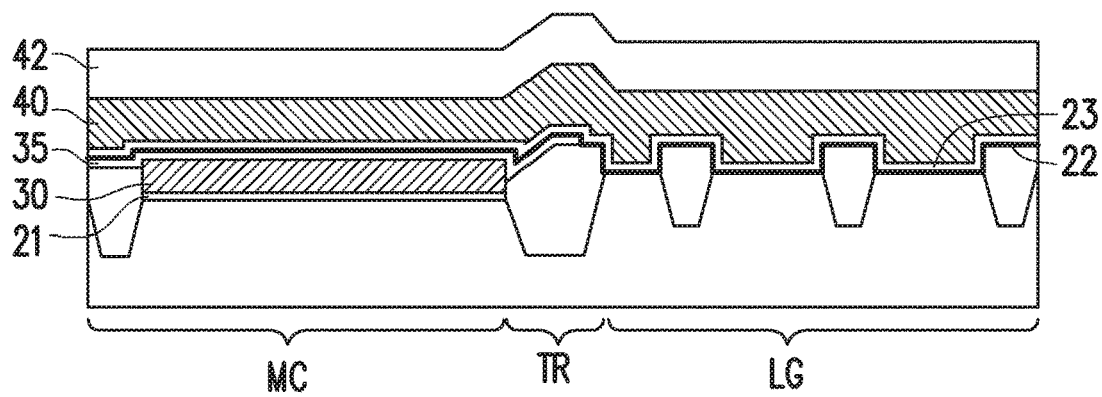
FIGS. 3A-3C show exemplary cross sectional views illustrating a sequential process for manufacturing a semiconductor device including non-volatile memory cells and peripheral logic circuits according to one embodiment of the present disclosure.

Subsequent to FIG. 2D, a third dielectric layer 23 is formed over the NVM cell area MC and the logic circuit area LG, as shown in FIG. 3A. In some embodiments, an interfacial silicon oxide layer 22 is formed before forming the third dielectric layer 23. In such a case, the combination of the layers 22 and 23 may be referred to as the third dielectric layer. The thickness of the interfacial silicon oxide layer 22 is in a range from about 1 nm to about 10 nm in some embodiments.

The third dielectric layer 23 includes one or more layers of a high-k dielectric material having a dielectric constant higher than silicon nitride. In some embodiments, the third dielectric layer 23 includes one or more oxides of Hf, Y, Ta, Ti, Al and Zr, or any other suitable dielectric material. In certain embodiments, $HfO_2$ is used.

The third dielectric layer 23 can be formed by CVD. The thickness of the third dielectric layer 23 is in a range from about 1 nm to about 50 nm in some embodiments. The third dielectric layer 23 is utilized as a gate dielectric layer for field effect transistors (FETs) of logic circuits in the logic circuit area LG.

Still referring to FIG. 3A, after the third dielectric layer 23 is formed, a second polysilicon layer 40 is formed over the NVM cell area MC and the logic circuit area LG. The second polysilicon layer 40 can be formed by CVD, and the thickness of the second polysilicon layer 40 is in a range from about 10 nm to about 100 nm, in some embodiments.

Further, as shown in FIG. 3A, a hard mask layer 42 is formed on the second polysilicon layer 40. In some embodiments, the hard mask layer 42 is made of silicon oxide formed by CVD, and the thickness thereof is in a range from about 10 nm to about 200 nm.

Figure 3B:
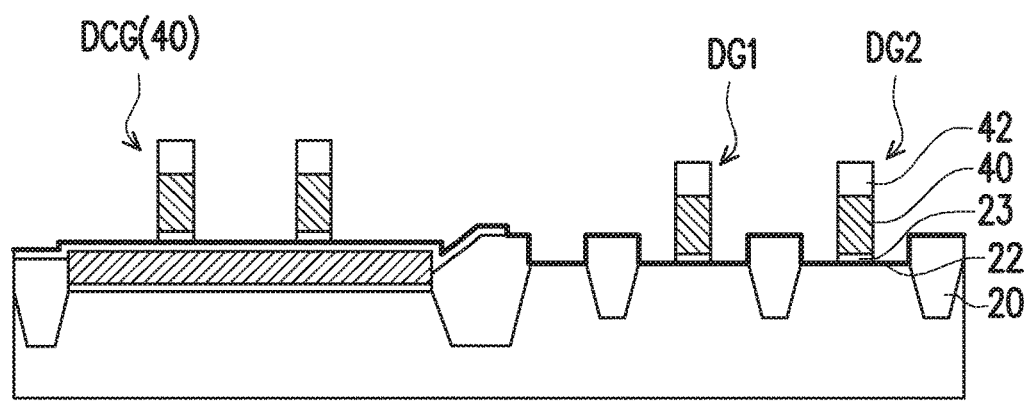

By using a patterning operation including lithography and etching, the hard mask layer 42 is patterned, and by using the patterned hard mask layer as an etching mask, the second polysilicon layer 40 is patterned as shows in FIG. 3B.

In the NVM cell area MC, the etching of the second polysilicon layer 40 substantially stops at the interfacial silicon oxide layer 22, while in the logic circuit area LG, the etching of the second polysilicon layer 40 also etches the third dielectric layer 23 (high-k dielectric layer) and stops at the interfacial silicon oxide layer 22. By this etching operation, dummy control gates DCG formed by the second polysilicon layer 40 are formed in the NVM cell area MC, and a first dummy gate DG1 and a second dummy gate DG2, both formed by the second polysilicon layer 40, are formed in the logic circuit area LG. In this disclosure, "dummy" generally means a layer or a structure that is subsequently removed or replaced with another material, or a layer or a structure which does not function as a part of an active circuit. However, even if not mentioned as dummy, some layers/materials may be subsequently replaced with another layer/material.

Figure 3C:
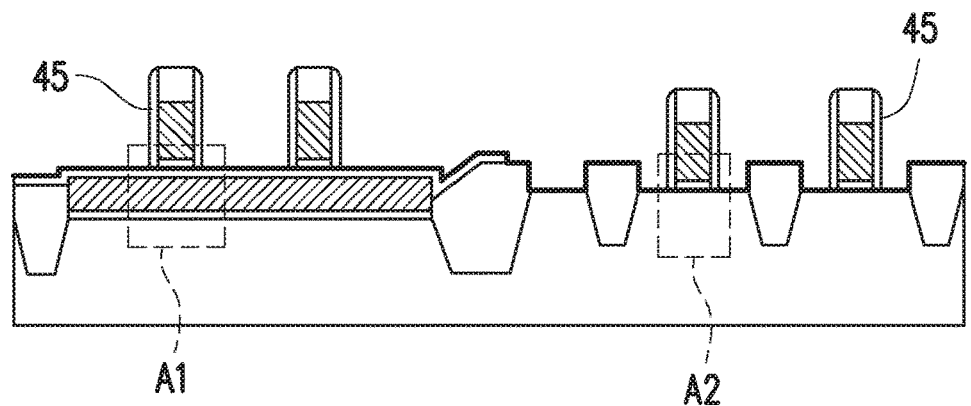

After the patterning operation of the second polysilicon layer 40, first sidewall spacers 45 are formed on both sides of the patterned second polysilicon layers both in the NVM cell area MC and in the logic circuit area LG, as shown in FIG. 3C.

The first sidewall spacers 45 are made of silicon oxide in some embodiments. A blanket layer of silicon oxide is formed, for example by CVD, over the entire substrate and then anisotropic etching is performed, thereby forming the first sidewall spacers 45. The thickness of the first sidewall spacers 45 is in a range from about 1 nm to about 20 nm in some embodiments.

Figure 4A:
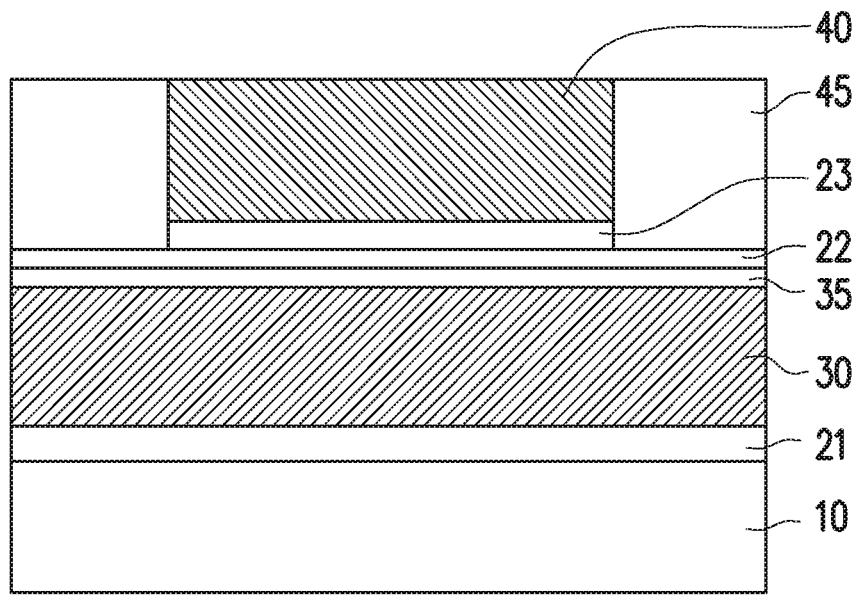
FIGS. 4A and 4B show enlarged cross sectional views illustrating stacked structures corresponding to areas A1 and A2 of FIG. 3C, respectively.
Figure 4B:
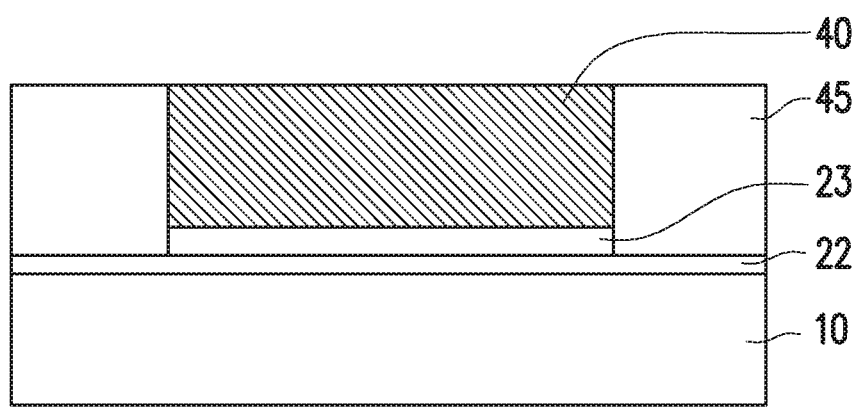

FIGS. 4A and 4B show exemplary cross sectional views illustrating stacked structures corresponding to areas A1 and A2 of FIG. 3C, respectively.

At this stage of the manufacturing process, in the NVM cell area MC, the second polysilicon layer 40, the high-k dielectric layer 23, the interfacial silicon oxide layer 22, the second dielectric layer 35, the first polysilicon layer 30, and the tunnel silicon oxide layer 21 are stacked on the substrate 10, as shown in FIG. 4A. In the actual device, the interface between the interfacial silicon oxide layer 22 and the second dielectric layer 35 may not be observed, when they are formed by the same material. In the logic circuit area LG, the first polysilicon layer 30, high-k dielectric layer 23 and the interfacial silicon oxide layer 22 are stacked on the substrate 10, as shown in FIG. 4B.

Figure 5A:
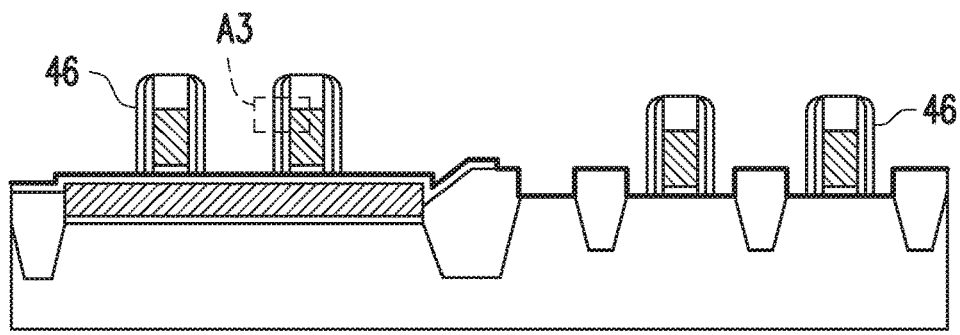
FIGS. 5A, 5C and 5D show exemplary cross sectional views illustrating a sequential process for manufacturing a semiconductor device including non-volatile memory cells and peripheral logic circuits according to one embodiment of the present disclosure.
Figure 5B:
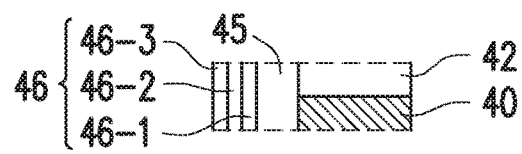
FIG. 5B is an enlarged cross sectional view illustrating a stacked structure corresponding to area A3 of FIG. 5A.

Further, as shown in FIG. 5A, after the first sidewall spacers 45 are formed, second sidewall spacers 46 are formed over the first sidewall spacers 45. The second sidewall spacers 46 include an ONO film having a silicon nitride layer 46-2 sandwiched by two silicon oxide layers 46-1 and 46-3, as shown in FIG. 5B, which is an enlarged cross sectional view corresponding to area A3 of FIG. 5A. The thicknesses of the silicon oxide layer 46-1, the silicon nitride layer 46-2 and the silicon oxide layer 46-3 are in ranges about 1-20 nm, about 1-30 nm and about 1-20 nm, respectively, in some embodiments. In certain embodiments, the second sidewall spacers 46 are a single layer of silicon nitride or silicon oxynitride.

Figure 5C:
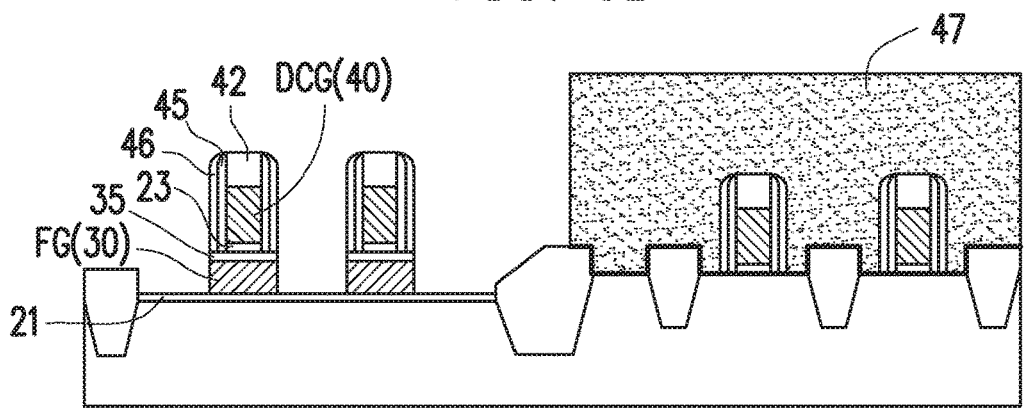

After the second sidewall spacers 46 are formed, the high-k dielectric layer 23, the interfacial layer 22, the second dielectric layer 35 and the first polysilicon layer 30 are patterned by using dry etching operations, while the logic circuit area LG is covered by a protective layer 47, as shown in FIG. 5C. The etching of the first polysilicon layer also removes the third dielectric layer 23 and stops at the first dielectric layer 21 or the interfacial silicon oxide layer 22. The protective layer 47 may be a photo resist layer, and after the etching of the first polysilicon layer 40, the protective layer 47 is removed.

Figure 5D:
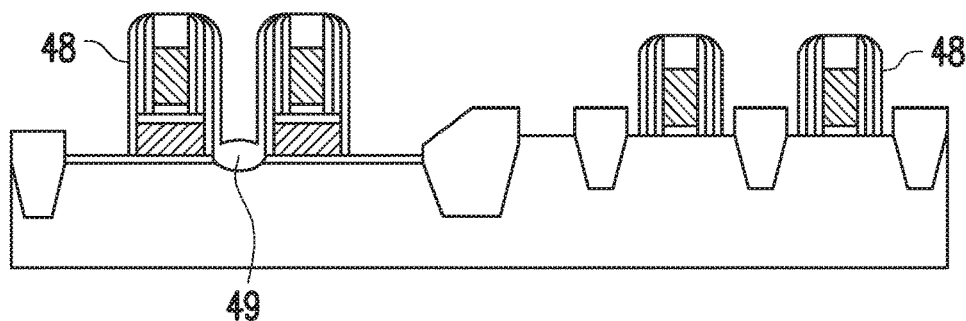

Further, as shown in FIG. 5D, third sidewall spacers 48 are formed, and an erase-gate oxide 49 is formed. The third sidewall spacers 48 are made of one or more layers of dielectric material. In one embodiment, the third sidewall spacers 48 are made of silicon nitride. The erase-gate oxide 49 is made of silicon oxide. In some embodiments, a silicon oxide layer is formed and then the silicon oxide layer is patterned to remove the silicon oxide layer from an erase gate area, and then wet oxidation is performed, thereby forming the erase-gate oxide 49. At this stage of the manufacturing process, in the NVM cell area MC, the first dielectric layer 21, the first polysilicon layer 30 as a floating gate (FG), the second dielectric layer 35, the interfacial layer 22, the third dielectric layer 23, the second polysilicon layer 40 and the hard mask layer 42 constitute stacked structures with sidewall spacers. In the logic circuit area LG, the interfacial layer 22, the third dielectric layer 23 and the second polysilicon layer 40 as a dummy layer and the hard mask layer 42 with sidewall spacers constitute the first and second gate stacks.

Figure 6A:
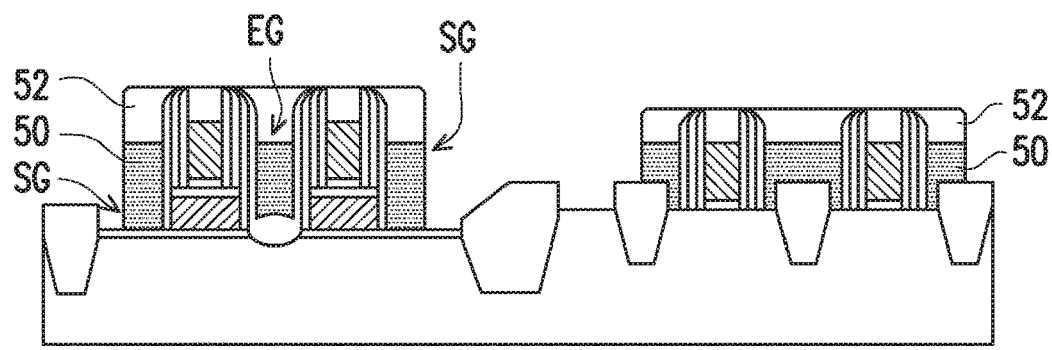
FIGS. 6A-6C show exemplary cross sectional views illustrating a sequential process for manufacturing a semiconductor device including non-volatile memory cells and peripheral logic circuits according to one embodiment of the present disclosure.
Figure 6B:
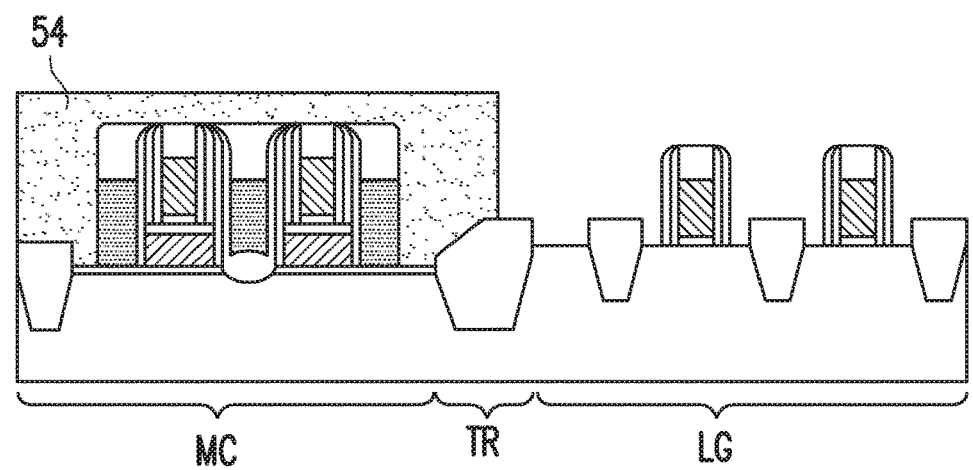

Then, in the NVM cell area MC, an erase gate EG is formed between the stacked structure and select gates SG are formed at sides of the stacked structure at which the erase gate is not formed, as shown in FIG. 6A. A third polysilicon layer 50 is formed over the NVM cell area MC and the logic circuit area LG, and a hard mask layer 52 is formed on the third polysilicon layer. Then, patterning operations are performed and the erase gate EG and the select gates (word lines) SG are formed, as shown in FIG. 6A. In the logic circuit area LG, similar structures may be formed on sides of the first and second gate stacks. The thickness of the third polysilicon layer 50 for the erase gate EG and the select gates SG is in a range from about 40 nm to about 200 nm in some embodiments. The hard mask layer 52 is made of one or more layers of silicon oxide, silicon nitride and silicon oxynitride, and has a thickness of about 20 nm to 200 nm in some embodiments. In some embodiments, if the first dielectric layer 21 is etched by the aforementioned etching operation, a new dielectric layer is formed for a gate dielectric layer of select gates.

Subsequently, the hard mask layer 52 and the third polysilicon layer 50 are removed in the logic circuit area LG, while the NVM cell area MC is protected by a cover layer 54. In some embodiments, the cover layer 54 is a photo resist layer.

Figure 6C:
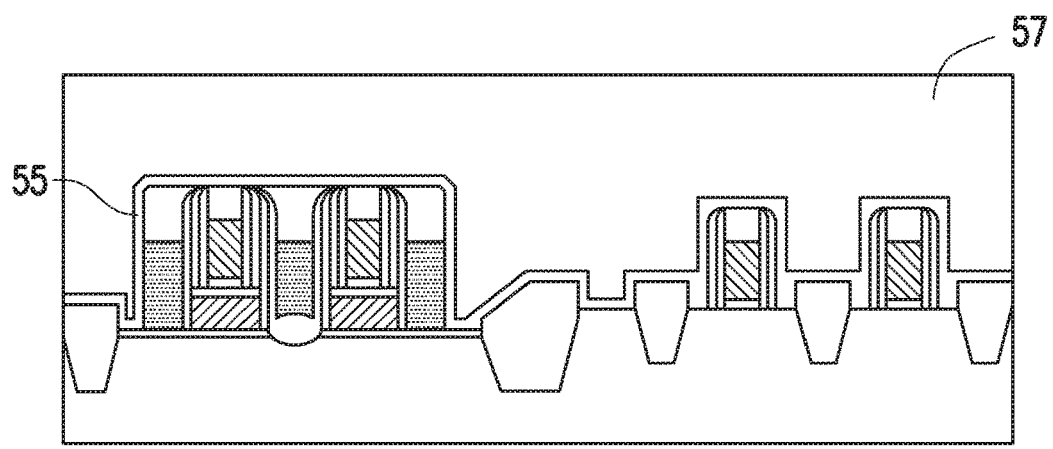

After the hard mask layer 52 and the third polysilicon layer 50 are removed in the logic circuit area LG, a silicon nitride cover layer 55 is formed over the NVM cell area MC and the logic circuit area LG, and further a fourth dielectric layer 57 is formed on the silicon nitride cover layer 55, as shown in FIG. 6C.

The silicon nitride cover layer 55 can be formed by CVD, and has a thickness of about 10 nm to about 50 nm in some embodiments. The fourth dielectric layer 57 includes one or more layers of $SiO_2$, SiN, SiOC, SiCN, SiOCN or SiON, or any other suitable dielectric material, and can be formed by CVD. The thickness of the fourth dielectric layer 57 is in a range from about 50 nm to about 1000 nm so that the structures on the NVM cell area MC and the logic circuit area LG are fully embedded in the fourth dielectric layer 57.

Figure 7A:
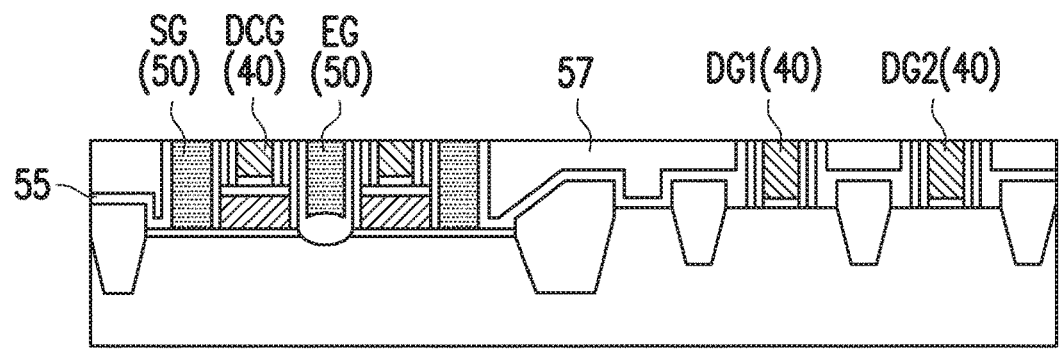
FIGS. 7A-7C show exemplary cross sectional views illustrating a sequential process for manufacturing a semiconductor device including non-volatile memory cells and peripheral logic circuits according to one embodiment of the present disclosure.

After the fourth dielectric layer 57 is formed, the fourth dielectric layer and the upper portions of the stacked structures in the NVM cell area MC and the gate stacks in the logic circuit area LG are planarized by CMP, as shown in FIG. 7A. By the planarization operation using CMP, the upper portions of the erase gate EG and the select gates SG made of the third polysilicon layer 50, the upper portions of the dummy control gates DCG made of the second polysilicon layer 40, and the upper portions of the dummy gates DG1, DG2 made of the second polysilicon layer 40 are exposed, as shown in FIG. 7A.

Figure 7B:
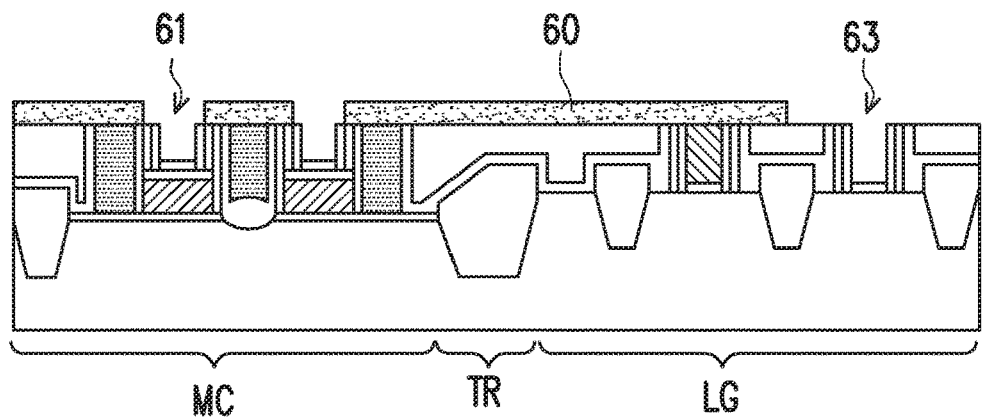

Next, a first mask pattern 60 is formed so that the upper portions of the dummy control gates DCG, and the upper portion of the dummy gate DG2 are exposed from the first mask pattern 60. The first mask pattern 60 is made of a photo resist in some embodiments, and is made of silicon nitride, aluminum oxide or transition metal nitride in other embodiments. Then, the second polysilicon layers 40 of the dummy control gates DCG and the second polysilicon layer 40 of the dummy gate DG2 are removed so as to form openings 61 and 63, respectively, as shown in FIG. 7B.

Figure 7C:
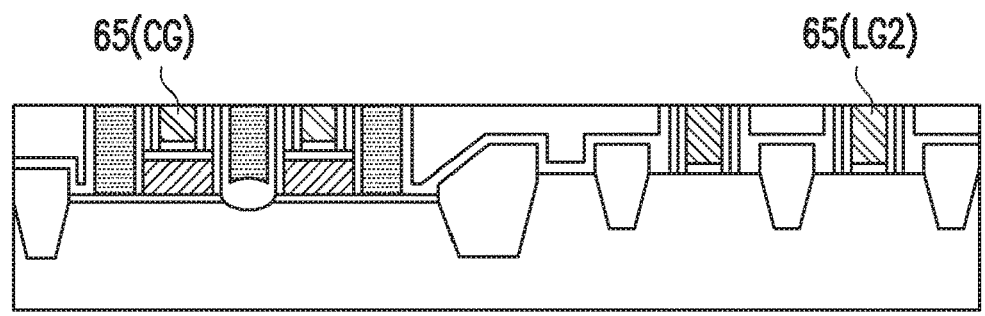

After the openings 61 and 63 are formed, the openings are filled with one or more layers of first conductive material 65, as shown in FIG. 7C. In some embodiments, the first conductive material 65 includes a work function adjustment layer and a body metal layer.

In the present disclosure, the dummy gate DG1 is for either one of a p-channel FET and an n-channel FET and the dummy gate DG2 is for the other one of the p-channel FET and the n-channel FET. For the n-channel FET, one or more of TaN, TaAlC, TiN, TiC, Co, TiAl, HfTi, TiSi and TaSi, or any other suitable conductive material is used as the work function adjustment layer, and for the p-channel FET, one or more of TiAlC, Al, TiAl, TaN, TaAlC, TiN, TiC and Co, or any other suitable conductive material is used as the work function adjustment layer. In this embodiment, the work function adjustment layers for the p-channel FET and the n-channel FET are different from each other. The body metal layer for the p-channel FET and the n-channel FET may be the same or different, and includes one or more of Al, Cu, W, Ti, Ta, TiN, TiAl, TiAlC, TiAlN, TaN, NiSi, CoSi, and other suitable conductive materials.

In one embodiment of the present disclosure, the dummy gate DG2 is for a p-channel FET. Thus, the structure of the first conductive material 65 for the control gate CG is the same as that of the gate LG2 of the p-channel FET.

The conductive material layer 65 can be formed by depositing a thick conductive material layer, and performing planarization operations, such as CMP so as to remove the conductive material layer deposited on the upper surface of the fourth dielectric layer 57. The first mask pattern 60 may also be removed during the CMP.

Figure 8A:
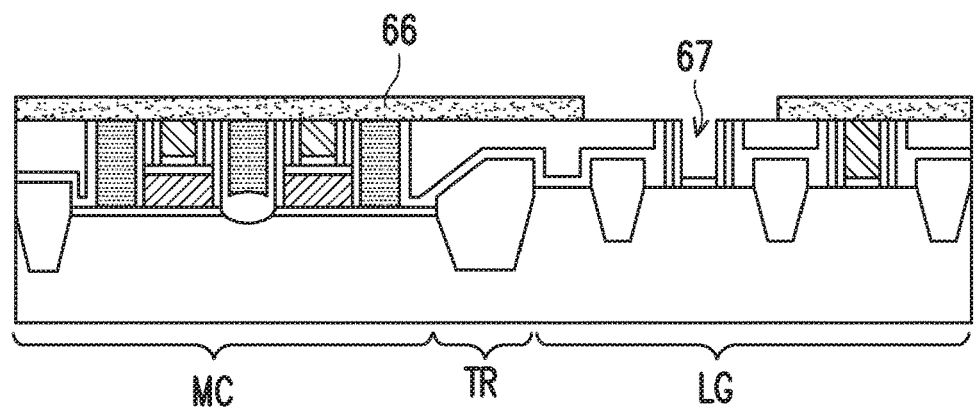
FIGS. 8A-8C show exemplary cross sectional views illustrating a sequential process for manufacturing a semiconductor device including non-volatile memory cells and peripheral logic circuits according to one embodiment of the present disclosure.
Figure 8B:
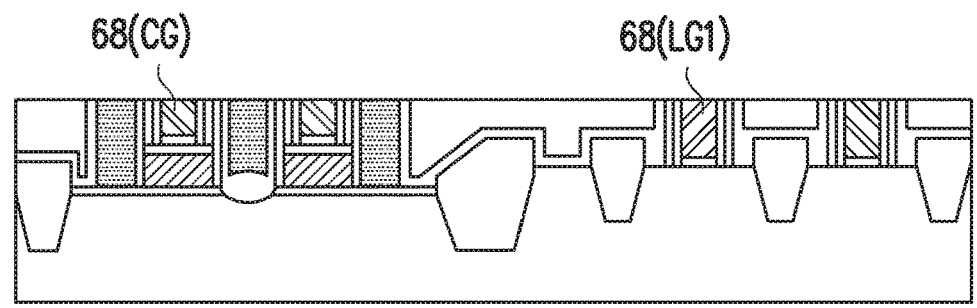

Then, as shown in FIG. 8A, a second mask pattern 66 is formed so that the upper portion of the dummy gate DG1 is exposed from the second mask pattern 66. The second mask pattern 66 is made of a photo resist in some embodiments, and is made of silicon nitride, aluminum oxide or transition metal nitride in other embodiments. Then, the second polysilicon layer 40 of the dummy gate DG1 is removed so as to form opening 67, as shown in FIG. 8A. Then, similar to the operations of FIG. 7C, the second conductive material layer 68 is formed in the opening 67 so as to form a metal gate LG1 for an n-channel FET, as shown in FIG. 8B.

Figure 8C:
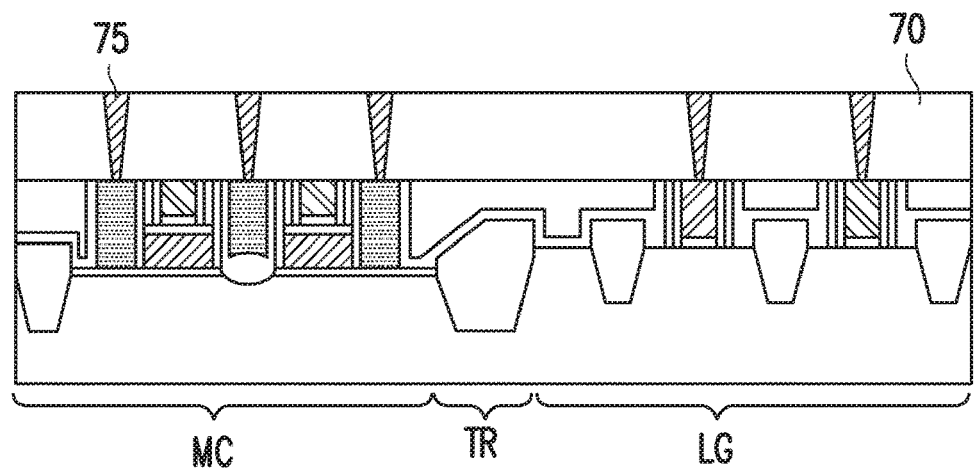

Subsequently, as shown in FIG. 8C, an interlayer dielectric (ILD) layer 70 is formed over the structure shown in FIG. 8B, and contact plugs 75 are formed. The ILD layer 70 includes one or more layers of silicon based insulating material, such as $SiO_2$, SiN, SiOC, SiCN, SiOCN or SiON, or any other suitable dielectric material formed by CVD. The thickness of the ILD layer 70 is in a range from about 100 nm to about 1000 nm in some embodiments. The contact plugs 75 are made of conductive material including one or more of Al, Cu, W, Ti, Ta, TiN, TiAl, TiAlC, TiAlN, TaN, NiSi, CoSi, and any other suitable conductive materials. Although not shown in FIG. 8C, contact plugs 75 are also disposed on the control gates.

FIGS. 9A-9C and 10A-10B show exemplary cross sectional views illustrating process for manufacturing a semiconductor device including non-volatile memory cells and peripheral logic circuits according to another embodiment of the present disclosure. The configurations, structures, materials, processes and/or operations similar to or the same as the foregoing embodiments described with FIGS. 1A-8C may be employed in the following embodiments, and the detailed explanation thereof may be omitted. In the following embodiments, the erase gate EG and select gates SG formed by the polysilicon layer 50 are dummy gates.

Figure 9A:
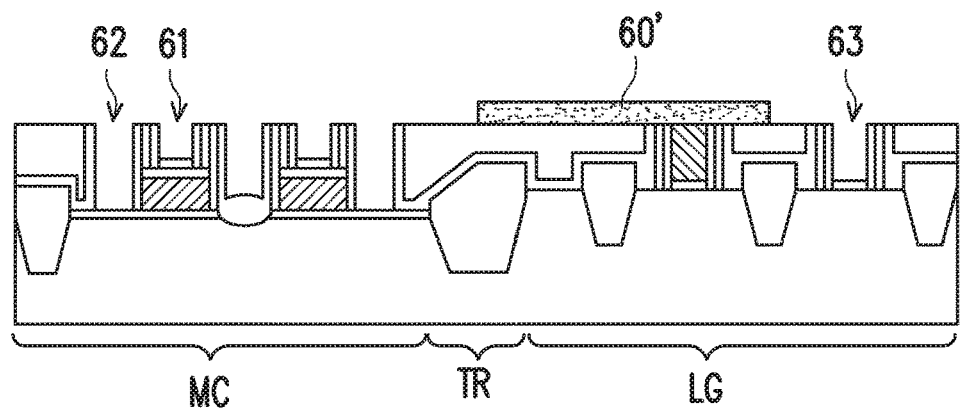
FIGS. 9A-9C show exemplary cross sectional views illustrating a sequential process for manufacturing a semiconductor device including non-volatile memory cells and peripheral logic circuits according to another embodiment of the present disclosure.

After the structure of FIG. 7A is formed, a first mask pattern 60' is formed so that the upper portions of the dummy control gates DCG, the erase gate EG and select gates SG and the upper portion of the dummy gate DG2 are exposed from the first mask pattern 60'. Then, the third polysilicon layers 50 of the erase gate EG and select gates SG, the second polysilicon layers 40 of the dummy control gates DCG and the second polysilicon layer 40 of the dummy gate DG2 are removed so as to form openings 62, 61 and 63, respectively, as shown in FIG. 9A.

After the openings 62, 61 and 63 are formed, the openings are filled with one or more layers of first conductive material

Figure 9B:
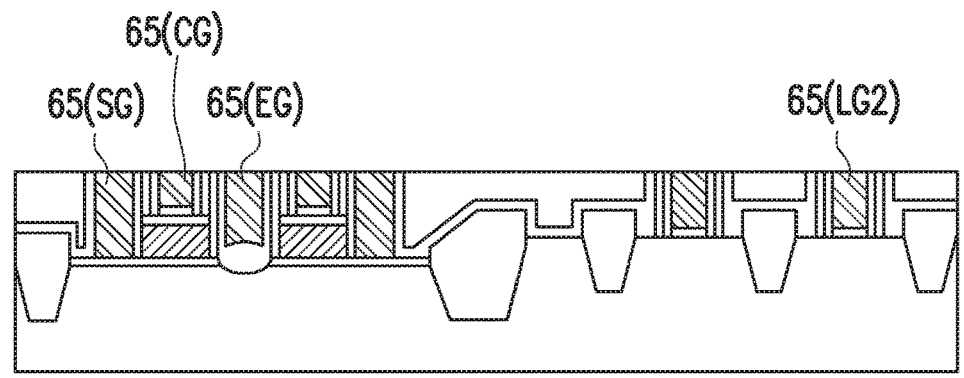

65, as shown in FIG. 9B, so as to form a metal erase gate EG, metal select gates SG, metal control gates CG and a metal gate LG2. In some embodiments, the first conductive material 65 includes a work function adjustment layer and a body metal layer.

Figure 9C:
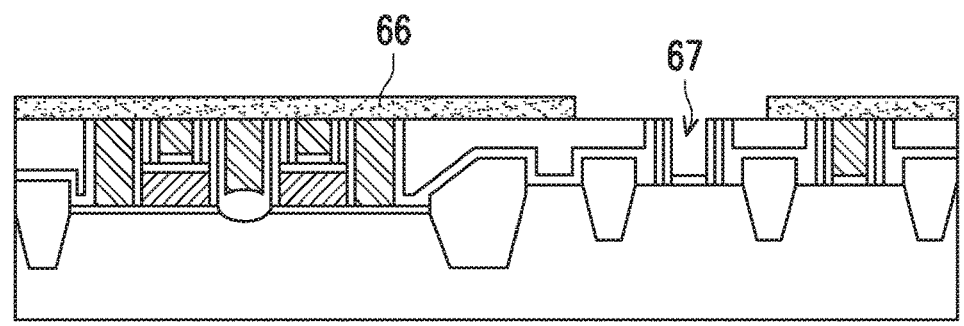
Figure 10A:
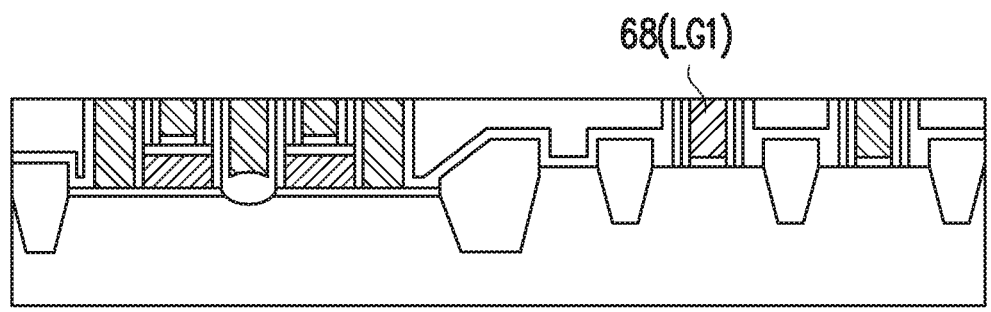
FIGS. 10A-10B show exemplary cross sectional views illustrating a sequential process for manufacturing a semiconductor device including non-volatile memory cells and peripheral logic circuits according to another embodiment of the present disclosure.

Then, similar to FIG. 8A, a second mask pattern 66 is formed so that the upper portion of the dummy gate DG1 is exposed from the second mask pattern 66, and the second polysilicon layer 40 of the dummy gate DG1 is removed so as to form opening 67, as shown in FIG. 9C. Then, similar to the operations of FIG. 7C or 9B, the second conductive material layer 68 is formed in the opening 67 so as to form a metal gate LG1 for an n-channel FET, as shown in FIG. 10A.

Figure 10B:
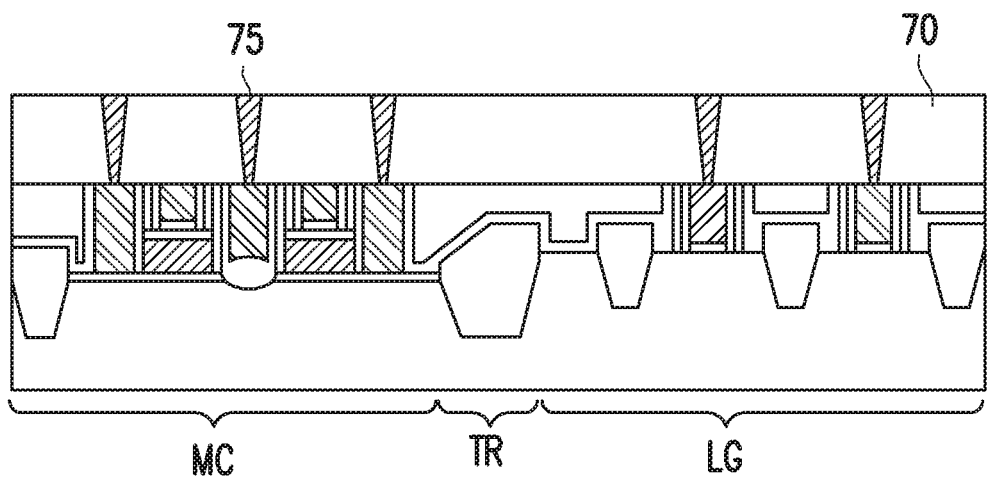

Subsequently, similar to FIG. 8C, an interlayer dielectric (ILD) layer 70 is formed over the structure shown in FIG. 10A and contact plugs 75 are formed, as shown in FIG. 10B.

Figure 11A:
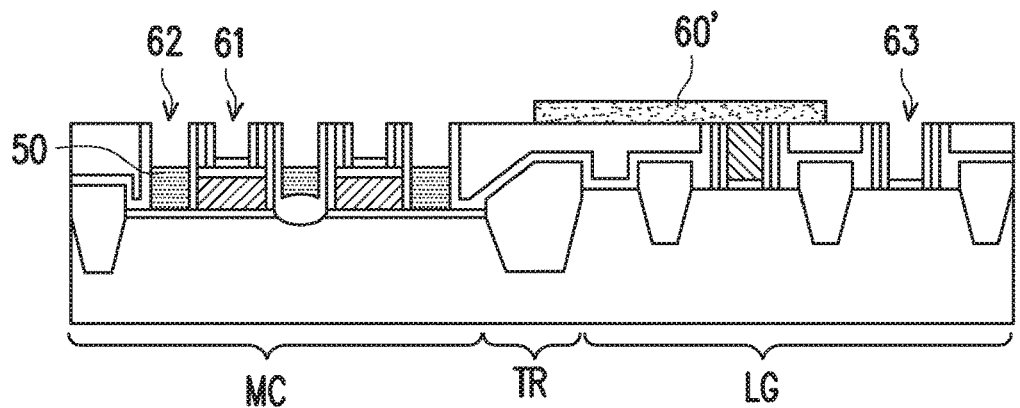
FIGS. 11A-11C show exemplary cross sectional views illustrating a sequential process for manufacturing a semiconductor device including non-volatile memory cells and peripheral logic circuits according to another embodiment of the present disclosure.
Figure 11B:
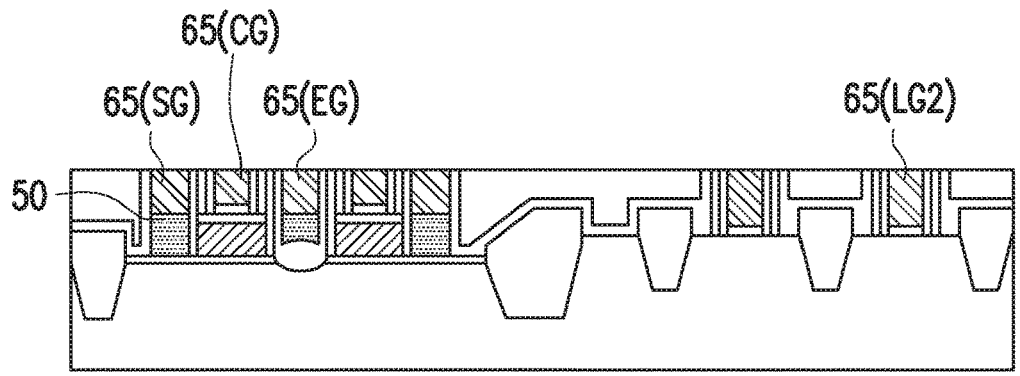
Figure 11C:
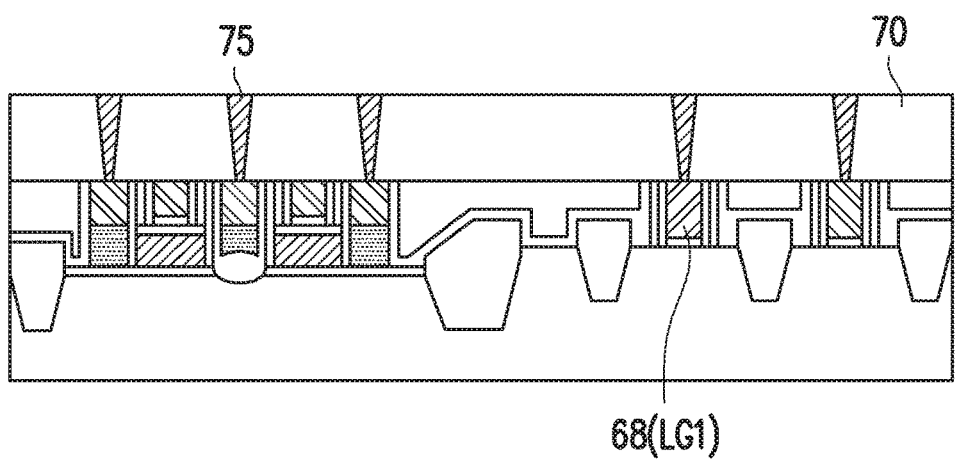

FIGS. 11A-11C show exemplary cross sectional views illustrating process for manufacturing a semiconductor device including non-volatile memory cells and peripheral logic circuits according to another embodiment of the present disclosure. The configurations, structures, materials, processes and/or operations similar to or the same as the foregoing embodiments described with FIGS. 1A-10B may be employed in the following embodiment, and the detailed explanation thereof may be omitted. In the following embodiments, the upper parts of the erase gate EG and select gates SG formed by the polysilicon layer 50 are dummy patterns to be replaced with metal material.

After the structure of FIG. 7A is formed, a first mask pattern 60' is formed so that the upper portions of the dummy control gates DCG, the erase gate EG and select gates SG and the upper portion of the dummy gate DG2 are exposed from the first mask pattern 60'. Then, the third polysilicon layers 50 of the erase gate EG and select gates SG, the second polysilicon layers 40 of the dummy control gates DCG and the second polysilicon layer 40 of the dummy gate DG2 are removed so as to form openings 62, 61 and 63, respectively, as shown in FIG. 11A.

Unlike the foregoing embodiment shown in FIG. 9A, the third polysilicon layers 50 of the erase gate EG and select gates SG are only partially removed and the third polysilicon layers 50 remain at the bottoms of the openings 62, as shown in FIG. 11A. Since the thickness of the third polysilicon layer 50 is much greater than the thickness of the second polysilicon layer 40 for the dummy control gates DCG and the second polysilicon layer 40 for the dummy gate DG2, the third polysilicon layers 50 remain at the bottoms of the openings 62 when the second and first polysilicon layers are fully removed by etching.

Then, by similar operations described with FIGS. 7C and/or 9B, the metal erase gate EG, the metal select gates SG, the metal control gates CG and the metal gate LG2 for the p-channel FET are formed with the first conductive material 65, as shown in FIG. 11B. Subsequently, by similar operations described with FIGS. 8A-8B and/or 10A-10B, the metal gate LG1 for the n-channel FET is formed with second conductive material 68, and the ILD layer 70 and the contact plugs 75 are formed, as shown in FIG. 11C.

Figure 12:
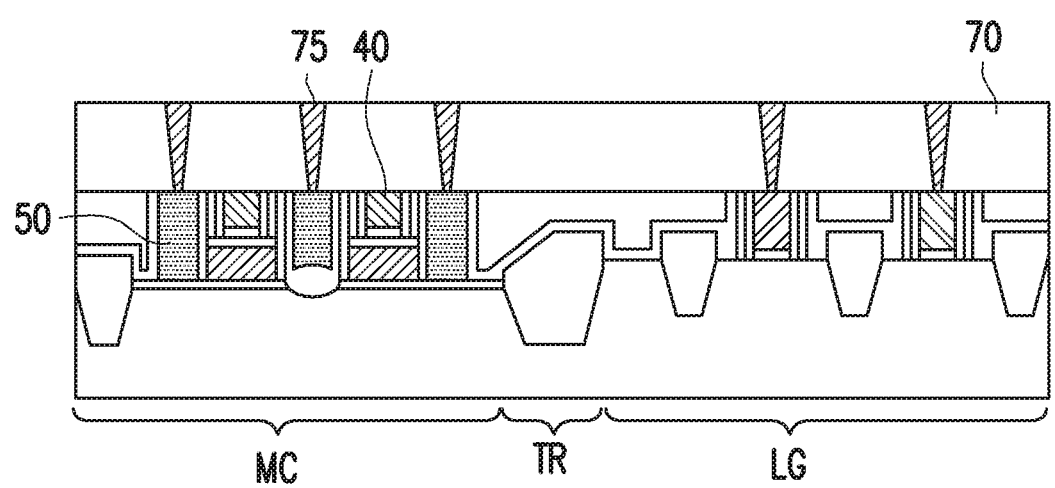
FIG. 12 shows an exemplary cross sectional view illustrating a sequential process for manufacturing a semiconductor device including non-volatile memory cells and peripheral logic circuits according to another embodiment of the present disclosure.

FIG. 12 shows an exemplary cross sectional view illustrating process for manufacturing a semiconductor device including non-volatile memory cells and peripheral logic circuits according to another embodiment of the present disclosure. The configurations, structures, materials, processes and/or operations similar to or the same as the foregoing embodiments described with FIGS. 1A-11C may be employed in the following embodiments, and the detailed explanation thereof may be omitted.

In this embodiment, the polysilicon layers 40 for the control gates and the polysilicon layers 50 for the erase gates and the select gates are not replaced with metal material. Thus, the dummy control gate is an actual control gate. As shown in FIG. 12, the gates of NVM cells are all made of polysilicon, which is appropriately doped for each gate, and do not include metal material used for FETs in the logic circuit area.

In the foregoing embodiments, a non-volatile memory (NVM) cell includes a tunnel oxide layer 21 disposed on a substrate 10, a floating gate FG made of the first polysilicon layer 30 and disposed over the first dielectric layer 21 as a tunnel oxide layer, a second dielectric layer 35 disposed on the floating gate FG, a high-k dielectric layer 23 formed over the second dielectric layer 35 and a control gate CG made of the conductive material 65 (or the second polysilicon layer 40). Further, an interfacial silicon oxide layer 22 may be formed between the second dielectric layer 35 and the high-k dielectric layer 23.

In the logic circuit area LG, a gate structure for an FET includes the interfacial layer 22 formed on the substrate 10, the high-k dielectric layer 23 formed on the interfacial layer 22 and a conductive material layer 65 or 67 formed over the high-k dielectric layer 23.

Further, in the forgoing embodiments, the gate LG1 is for an n-channel FET and the gate LG2 is for a p-channel FET. In certain embodiments, the gate LG1 is for a p-channel FET and the gate LG2 is for an n-channel FET. In such a case, the same conductive material structure 65 is used for the gates of the NVM cells and the gate of the n-channel FET. In other words, the metal gates for the NVM cells have the same conductive metal structure as either one of a p-channel FET or an n-channel FET in the logic circuit area LG.

It will be understood that not all advantages have been necessarily discussed herein, no particular advantage is required for all embodiments or examples, and other embodiments or examples may offer different advantages.

According to some embodiments of the present disclosure, since the control gates of the NVM cells are made of metal material, resistance of the control gates can be reduced. Further, according to some embodiments of the present disclosure, since the erase gate and select gates of the NVM cells are made of metal material, resistance of these gates and contact resistance between the gates and the contact plugs can be reduced. Further, since the gate replacement process is performed for the NVM cell area and the logic circuit area at the same time, it is possible to minimize an increase of the number of lithograph operations. In addition, it is possible to avoid placing dummy structures at the transition area to compensate a height difference between the NVM cell area and the logic circuit area.

In accordance with one aspect of the present disclosure, in a method for manufacturing a semiconductor device including a non-volatile memory, a cell structure is formed. The cell structure includes a stacked structure and third poly silicon layers disposed at both sides of the stacked structure. The stacked structure includes a first poly silicon layer disposed over a first dielectric layer, a second dielectric layer disposed over the first polysilicon layer, a third dielectric layer disposed over the second dielectric layer, and a second polysilicon layer disposed over the third dielectric layer. The second polysilicon layer is at least partially removed, thereby forming a control gate space. A conductive material is formed in the control gate space.

In accordance with another aspect of the present disclosure, in a method for manufacturing a semiconductor device including a non-volatile memory disposed in a memory cell area and a field effect transistor disposed in a logic circuit area, a first dielectric layer is formed in the memory cell area. A cell structure for the non-volatile memory is formed in the memory cell area. The cell structure includes a stacked structure and third poly silicon layers disposed at both sides of the stacked structure. The stacked structure includes a first poly silicon layer disposed over a first dielectric layer, a second dielectric layer disposed over the first polysilicon layer, a third dielectric layer disposed over the second dielectric layer, and a second polysilicon layer disposed over the third dielectric layer. A dummy gate structure for the field effect transistor is formed in the logic circuit area. The dummy gate structure includes a gate dielectric layer disposed over the substrate and a dummy logic gate made of polysilicon and disposed over the gate dielectric layer. The second polysilicon layer is at least partially removed in the memory cell area, thereby forming a control gate space, and the dummy logic gate of the dummy logic gate is at least partially removed, thereby forming a first logic gate space. A conductive material is formed in the control gate space and the first logic gate space. The third dielectric layer includes a dielectric material having a dielectric constant higher than silicon nitride.

In accordance with another aspect of the present disclosure, a semiconductor device includes a non-volatile memory. The non-volatile memory includes a first dielectric layer disposed on a substrate, a floating gate disposed on the dielectric layer, a control gate. A second dielectric layer is disposed between the floating gate and the control gate, having a silicon nitride layer, a silicon oxide layer and multilayers thereof. A third dielectric layer is disposed between the second dielectric layer and the control gate, and includes a dielectric material having a dielectric constant higher than silicon nitride.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device including a non-volatile memory, the method comprising:
    forming a cell structure, the cell structure including:
        a stacked structure including a first poly silicon layer disposed over a first dielectric layer, a second dielectric layer disposed over the first polysilicon layer, a third dielectric layer disposed over the second dielectric layer, and a second polysilicon layer disposed over the third dielectric layer; and
        third poly silicon layers disposed at both sides of the stacked structure;
    at least partially removing the second polysilicon layer, thereby forming a control gate space; and
    forming a conductive material in the control gate space, wherein the forming the cell structure comprises:
        forming the first dielectric layer over a substrate;
        forming a first polysilicon film for the first polysilicon layer over the first dielectric layer;
        forming a second dielectric film for the second dielectric layer over the first polysilicon film;
        forming a third dielectric film for the third dielectric layer over the second dielectric film;
        forming a second polysilicon film for the second polysilicon layer over the third dielectric film;
        patterning the second polysilicon film and the third dielectric film, thereby forming the second polysilicon layer and the third dielectric layer;
        after the second polysilicon layer and the third dielectric layer are formed, patterning the second dielectric film and the first polysilicon film, thereby forming the stacked structure;
        forming a third polysilicon layer for the third polysilicon layers at both sides of the stacked structure; and
        performing a planarization operation on the stacked structure and the third polysilicon layer.

2. The method of claim 1, wherein the third dielectric layer includes one or more oxide layers of Hf, Y, Ta, Ti, Al and Zr.

3. The method of claim 2, wherein the third dielectric layer further includes a silicon oxide layer.

4. The method of claim 1, wherein the second dielectric layer is a silicon oxide layer, a silicon nitride layer or multilayers thereof.

5. The method of claim 1, wherein the first dielectric layer is silicon oxide.

6. The method of claim 1, further comprising, after the second polysilicon film and the third dielectric film are patterned and before the second dielectric film and the first polysilicon film are patterned, forming first sidewall spacers on both sides of the patterned second polysilicon film.

7. The method of claim 6, further comprising, after the first sidewall spacers are formed and before the second dielectric film and the first polysilicon film are patterned, forming second sidewall spacers over the first sidewall spacers.

8. The method of claim 7, wherein the third sidewall spacers include one of a silicon oxide layer, a silicon nitride layer and multilayers thereof.

9. The method of claim 1, wherein:
    when the second polysilicon layer is at least partially removed, the third polysilicon layers are also at least partially removed, thereby forming select gate spaces and an erase gate space, and
    the conductive material is also formed in the select gate spaces and the erase gate space, thereby forming a select gate and an erase gate.

10. A method for manufacturing a semiconductor device including a non-volatile memory disposed in a memory cell area and a field effect transistor disposed in a logic circuit area, the method comprising:
    forming a cell structure for the non-volatile memory in the memory cell area, the cell structure comprising:
        a stacked structure including a first poly silicon layer disposed over a first dielectric layer, a second dielectric layer disposed over the first polysilicon layer, a third dielectric layer disposed over the second dielectric layer, and a second polysilicon layer disposed over the third dielectric layer; and
        third poly silicon layers disposed at both sides of the stacked structure;
    forming a dummy gate structure for the field effect transistor in the logic circuit area, the dummy gate structure comprising:

a gate dielectric layer disposed over the substrate; and
a dummy logic gate made of polysilicon and disposed over the gate dielectric layer;
at least partially removing the second polysilicon layer in the memory cell area, thereby forming a control gate space and at least partially removing the dummy logic gate of the dummy logic gate, thereby forming a first logic gate space; and
forming a conductive material in the control gate space and the first logic gate space, wherein the cell structure and the dummy logic gate structure are formed by:
forming the first dielectric layer in the memory cell area;
forming a first polysilicon film for the first polysilicon layer over the first gate dielectric layer in the memory cell area;
forming a second dielectric film for the second dielectric layer over the first polysilicon film in the memory cell area;
after the second dielectric film is formed, forming a third dielectric film for the third dielectric layer and the gate dielectric layer in the memory cell area and the logic circuit area;
forming a second polysilicon film for the second polysilicon layer and the dummy logic gate over the second dielectric film in the memory cell area and the logic circuit area;
patterning the second polysilicon film and the third dielectric film in the memory cell area, thereby forming the second polysilicon layer and patterning the second polysilicon film and the third dielectric film in the logic circuit area, thereby forming the dummy logic gate and the gate dielectric layer;
after the second polysilicon layer and the third dielectric layer are patterned, patterning the second dielectric film and the first polysilicon film in the memory cell area, thereby forming the stacked structure in the memory cell area;
forming a third polysilicon film for the third polysilicon layers; and
performing a planarization operation on the stacked structure, the third polysilicon layer and the dummy logic gate, and
the third dielectric layer includes a dielectric material having a dielectric constant higher than silicon nitride.

11. The method of claim 10, wherein the third dielectric layer includes one or more oxide layers of Hf, Y, Ta, Ti, Al and Zr.

12. The method of claim 10, wherein:
the second dielectric layer is one of a silicon oxide layer, a silicon nitride layer and multilayers thereof, and
the dummy logic gate does not include the second dielectric film.

13. The method of claim 10, further comprising, after the second polysilicon film and the third dielectric film are patterned and before the second dielectric film and the first polysilicon film are patterned, forming first sidewall spacers on both sides of the second polysilicon layer and on both sides of the dummy logic gate.

14. The method of claim 13, further comprising, after the first sidewall spacers are formed and before the second dielectric film and the first polysilicon film are patterned, forming second sidewall spacers over the first sidewall spacers.

15. The method of claim 14, wherein the third sidewall spacers includes one of a silicon oxide layer, a silicon nitride layer and multilayers thereof.

16. The method of claim 10, wherein:
when the second polysilicon layer is at least partially removed, the third polysilicon layers in the memory cell area are also at least partially removed, thereby forming a select gate space and an erase gate space, and
the conductive material is also formed in the select gate space and the erase gate space.

17. The method of claim 16, wherein:
the second polysilicon layer in the memory cell area is fully removed, and
the third polysilicon layers in the memory cell area are not fully removed, and the conductive material is formed on the remaining third polysilicon layers.

* * * * *